(12) United States Patent
Kim et al.

(10) Patent No.: US 8,829,689 B2
(45) Date of Patent: Sep. 9, 2014

(54) MODULE SUBSTRATE WITH FEATURE FOR REPLACEMENT OF FAULTY CHIPS, SEMICONDUCTOR MODULE HAVING THE SAME, AND METHOD FOR MANUFACTURING THE SEMICONDUCTOR MODULE

(75) Inventors: Ki Young Kim, Seongnam-si (KR); Sung Ho Hyun, Seoul (KR); Myung Gun Park, Seoul (KR); Jin Ho Bae, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 497 days.

(21) Appl. No.: 12/980,533

(22) Filed: Dec. 29, 2010

(65) Prior Publication Data

US 2011/0309529 A1 Dec. 22, 2011

(30) Foreign Application Priority Data

Jun. 16, 2010 (KR) ........................ 10-2010-0057060

(51) Int. Cl.
*H01L 23/053* (2006.01)
(Continued)

(52) U.S. Cl.
CPC ....... *H01L 24/81* (2013.01); *H01L 2225/06596* (2013.01); *H05K 2201/10378* (2013.01); *H01L 24/799* (2013.01); *H01L 2924/01024* (2013.01); *H01L 2924/014* (2013.01); *H01L 2924/01082* (2013.01); *H01L 2224/73204* (2013.01); *H01L 2924/01029* (2013.01); *H01L 2924/01049* (2013.01); *H01L 2224/16225* (2013.01); *H05K 3/225* (2013.01); *H01L 2924/0105* (2013.01); *H01L 24/98* (2013.01); *H05K 3/3436* (2013.01); *H01L 2924/01033* (2013.01); *H05K 2003/176* (2013.01); *H01L 2924/01077* (2013.01); *H01L 2224/48227* (2013.01); *H01L 2224/32225* (2013.01); *H01L 24/48* (2013.01); *H01L 2224/48091* (2013.01); *H01L 2924/01079* (2013.01); *H01L 24/16* (2013.01); *H01L 2924/01006* (2013.01); *H01L 2225/0651* (2013.01); *H01L 22/20* (2013.01); *H01L 2225/06517* (2013.01); *H01L 2224/73265* (2013.01); *H01L 25/0655* (2013.01); *H01L 2224/81193* (2013.01); *H01L 22/14* (2013.01); *H01L 2224/81801* (2013.01)
USPC ........... 257/783; 257/701; 257/702; 257/723; 257/750; 361/719; 361/760

(58) Field of Classification Search
CPC ................. H01L 2924/00; H01L 2924/00014; H01L 2224/48091; H01L 2224/48227; H01L 2224/32225; H01L 2924/01079; H01L 22/14; H01L 22/20; H01L 2224/16225; H01L 2224/81801; H01L 2224/81193; H01L 2224/73265; H01L 2224/73204; H01L 2225/0651; H01L 2225/06517; H01L 2225/06596; H01L 2924/01029; H01L 2924/01024; H01L 2924/01033; H01L 2924/01082; H01L 2924/0105; H01L 2924/014; H01L 2924/01077; H01L 2924/01049; H01L 2924/01006; H01L 24/98; H01L 24/81; H01L 24/16; H01L 24/799; H01L 24/48; H01L 25/0655; H01L 3/225; H01L 3/3436; H01L 2203/176
USPC ........ 257/723, 724, 782, 783, 780, 781, 737, 257/778; 438/4, 11, 14, 18, 799, FOR. 434; 361/719, 760, 783
See application file for complete search history.

(56) References Cited

U.S. PATENT DOCUMENTS 4,779,338 A * 10/1988 Kohara et al. .................. 29/832
4,811,081 A * 3/1989 Lyden ........................... 257/668
(Continued)

FOREIGN PATENT DOCUMENTS

JP 63092036 A * 4/1988 .............. H01L 21/60
JP 05259167 A 10/1993
(Continued)

*Primary Examiner* — Teresa M Arroyo
(74) *Attorney, Agent, or Firm* — William Park & Associates Patent Ltd.

(57) ABSTRACT

A module substrate may include a substrate body on which a plurality of chip mounting regions having connection pads are defined. Repair structures may be respectively formed, or placed, in the chip mounting regions. Each repair structure includes conductive layer patterns formed over the connection pads in each chip mounting region, an insulation layer pattern formed over the substrate body in each chip mounting region in such a way as to expose the conductive layer patterns, plastic conductive members formed between the connection pads and the conductive layer patterns, and a plastic insulation member formed between the substrate body and the insulation layer pattern in each chip mounting region.

13 Claims, 6 Drawing Sheets

(51) Int. Cl.
  *H01L 23/14*   (2006.01)
  *H01L 23/48*   (2006.01)
  *H01L 23/52*   (2006.01)
  *H01L 29/40*   (2006.01)
  *H01L 23/34*   (2006.01)
  *H05K 7/20*    (2006.01)
  *H05K 7/00*    (2006.01)
  *H05K 3/22*    (2006.01)
  *H01L 21/66*   (2006.01)
  *H01L 25/065*  (2006.01)
  *H01L 23/00*   (2006.01)
  *H05K 3/34*    (2006.01)

(56) References Cited

U.S. PATENT DOCUMENTS

| | | | |
|---|---|---|---|
| H629 H * | 4/1989 | Murdoch | 257/782 |
| 6,472,239 B2 * | 10/2002 | Hembree et al. | 438/18 |
| 6,833,628 B2 * | 12/2004 | Brandenburg et al. | 257/778 |
| 6,836,025 B2 * | 12/2004 | Fujisawa et al. | 257/782 |
| 7,666,709 B1 * | 2/2010 | Lin et al. | 438/106 |
| 2003/0209813 A1 * | 11/2003 | Azuma | 257/797 |
| 2005/0073055 A1 * | 4/2005 | Pan et al. | 257/778 |
| 2005/0084986 A1 * | 4/2005 | Hembree et al. | 438/4 |
| 2006/0113682 A1 * | 6/2006 | Farnworth et al. | 257/782 |
| 2006/0163722 A1 * | 7/2006 | Hsu | 257/737 |
| 2007/0096306 A1 * | 5/2007 | Yamagata | 257/734 |
| 2007/0281374 A1 * | 12/2007 | Lee et al. | 438/14 |
| 2008/0055873 A1 * | 3/2008 | Mi et al. | 361/761 |

FOREIGN PATENT DOCUMENTS

| | | |
|---|---|---|
| JP | 05036695 A | 12/1993 |
| JP | 08340000 A | 12/1996 |
| JP | 09283555 A | 10/1997 |

* cited by examiner

MODULE SUBSTRATE WITH FEATURE FOR REPLACEMENT OF FAULTY CHIPS, SEMICONDUCTOR MODULE HAVING THE SAME, AND METHOD FOR MANUFACTURING THE SEMICONDUCTOR MODULE

CROSS-REFERENCE TO RELATED APPLICATIONS

The present application claims priority to Korean patent application number 10-2010-57060 filed on Jun. 16, 2010, which is incorporated herein by reference in its entirety.

BACKGROUND OF THE INVENTION

The present invention generally relates to semiconductors, and more specifically to a module substrate that allows replacement of faulty semiconductor chips, a semiconductor module having the same, and a method for manufacturing the semiconductor module.

In general, semiconductor chips are packaged into various types such as a BGA (ball grid array) type, an LOC (lead-on-chip) type, a CSP (chip size package) type, and so forth, and are then mounted to PCB (printed circuit board) substrates and constitute modules.

Recently, a DCA (direct chip attachment) type has been proposed, in which non-packaged semiconductor chips are directly mounted to a PCB substrate so as to increase the mounting density of semiconductor chips and improve electrical characteristics. In the DCA type, after the semiconductor chips are bonded to the substrate, adhesive members or underfill members are formed between the substrate and the semiconductor chips in order to prevent joints between the semiconductor chips and the substrate from being damaged during testing or handling. However, since the semiconductor chips cannot be detached from the substrate, a faulty semiconductor chip cannot be appropriately replaced. The faulty semiconductor chip may be detected because it failed a test. Accordingly, the faulty semiconductor chip may also be referred to as a failed semiconductor chip.

In order to cope with this problem, a method of additionally providing a redundancy chip for replacing the failed semiconductor chip is generally known in the art. While this method is advantageous in terms of manufacturing yield, additional space is needed for mounting the redundancy chip. Further, as an area to be used for design is limited, the number of redundancy chips capable of being mounted is also limited. Therefore, in the case where a number of failed semiconductor chips exist in one semiconductor module, the desired improvement of manufacturing yield may be impeded. Moreover, because additional circuit wiring lines are needed to connect the redundancy chips, the design of the circuit wiring lines are complicated.

BRIEF SUMMARY OF THE INVENTION

An embodiment of the present invention is directed to a module substrate which can allow a DCA type semiconductor module to be repaired without using a redundancy chip, a semiconductor module having the same, and a method for manufacturing a semiconductor module.

In one embodiment of the present invention, a module substrate includes a substrate body on which a plurality of chip mounting regions having connection pads are defined. Repair structures are respectively formed, or mounted, in the chip mounting regions, where each repair structure includes conductive layer patterns formed over plastic conductive members. Accordingly, the conductive layer patterns may have an electrical connection to the connection pads in each chip mounting region. Each repair structure may also comprise an insulation layer pattern formed over a plastic insulation member, which is formed over the substrate body in each chip mounting region in such a way as to expose the conductive layer patterns, plastic conductive members which are formed between the connection pads and the conductive layer patterns, and a plastic insulation member which is formed between the substrate body and the insulation layer pattern in each chip mounting region. The plastic insulation member may have substantially the same height as the plastic conductive members, and the insulation layer pattern may have substantially the same height as the conductive layer patterns.

Accordingly, the insulator layer pattern and the plastic insulation member may provide support for a semiconductor chip that may be mounted on the repair structure.

The plastic conductive members may include a low melting point material. The plastic conductive members may have a lower melting point than, for example, the conductive layer patterns, the connection pads, the insulator layer pattern, or the substrate body.

Similarly, the plastic insulation members may include a low melting point material. The plastic insulation members may have a lower melting point than, for example, the conductive layer patterns, the connection pads, the insulator layer pattern, or the substrate body.

The plastic insulation member may include a thermoplastic adhesive or a pressure sensitive adhesive.

The substrate body may have a first surface and a second surface which faces away from the first surface, and the chip mounting regions may be defined on at least any one of the first surface and the second surface of the substrate body. The first surface may be, for example, a top surface, and the second surface may be, for example, a bottom surface.

In another embodiment of the present invention, a semiconductor module such as, for example, a memory module, may include a module substrate having a substrate body on which a plurality of chip mounting regions having connection pads are defined, and repair structures which are respectively formed in the plurality of chip mounting regions. Each repair structure may include conductive layer patterns formed over the connection pads in each chip mounting region, an insulation layer pattern which is formed over the substrate body in each chip mounting region in such a way as to expose the conductive layer patterns, The repair structures may comprise plastic conductive members formed between the connection pads and the conductive layer patterns. The repair structures may also comprise an insulation layer pattern formed over the substrate body in each chip mounting region in such a way as to expose the conductive layer patterns, and a plastic insulation member formed between the substrate body and the insulation layer pattern in each chip mounting region. A plurality of semiconductor chips may be respectively mounted in the chip mounting regions of the module substrate.

The repair structure may be removed from at least one of the plurality of chip mounting regions if a corresponding semiconductor chip is found to be faulty via a test.

The semiconductor module may further include connection members electrically connecting the semiconductor chips and the connection pads in the chip mounting regions. Underfill members or adhesive members may be formed, or placed, between the semiconductor chips and the module substrate in the chip mounting regions.

The plastic conductive members and the plastic insulation member may have a melting point lower than the connection members and the underfill members or the adhesive members.

The plastic conductive members may include a low melting point metal. The plastic conductive members may comprise material such as, for example, solder, lead, stannum, and iridium.

The plastic insulation member may include a thermoplastic adhesive or a pressure sensitive adhesive.

The substrate body may have a first surface and a second surface which faces away from the first surface, and the chip mounting regions may be defined on at least any one of the first surface and the second surface of the substrate body. The first surface may be, for example, a top surface, and the second surface may be, for example, a bottom surface.

In another embodiment of the present invention, a method for manufacturing a semiconductor module includes forming a module substrate having a substrate body on which a plurality of chip mounting regions having connection pads are defined. Repair structures may be respectively formed in the chip mounting regions. Each repair structure includes conductive layer patterns which are formed over the connection pads in each chip mounting region, an insulation layer pattern which is formed over the substrate body in each chip mounting region in such a way as to expose the conductive layer patterns, plastic conductive members which are formed between the connection pads and the conductive layer patterns, and a plastic insulation member which is formed between the substrate body and the insulation layer pattern in each chip mounting region. Semiconductor modules may be formed by mounting semiconductor chips on repair structures in the chip mounting regions of the module substrate, testing the semiconductor module, and removing a failed semiconductor chip that failed the testing and its corresponding repair structure, which is formed in a corresponding chip mounting region where the failed semiconductor chip is mounted. An additional semiconductor chip may then be mounted in the corresponding chip mounting region from which the faulty semiconductor chip and the corresponding repair structure were removed.

The module substrate may be formed by preparing the substrate body on which the plurality of chip mounting regions having the connection pads are defined and forming the repair structures in the chip mounting regions, respectively. The repair structures may have been manufactured as a part of the module substrate.

Alternatively, the repair structures may have been manufactured in the form of films separately from the substrate body and placed on the mounting pads in the chip mounting regions.

The repair structures in the respective chip mounting regions may include forming the conductive layer patterns over the connection pads in the chip mounting regions by the medium of the plastic conductive members, forming an insulation layer over the substrate body by the medium of plastic insulation members in such a way as to expose the conductive layer patterns, and removing portions of the insulation layer which are formed outside the chip mounting regions.

Removing the failed semiconductor chip and the repair structure formed in the corresponding chip mounting region may include melting the plastic conductive members and the plastic insulation member of the repair structure in the corresponding chip mounting region by applying heat to the failed semiconductor chip and detaching the failed semiconductor chip and the repair structure formed in the corresponding chip mounting region from the semiconductor module.

After removing the failed semiconductor chip and the repair structure formed in the corresponding chip mounting region, and before the step of mounting the additional semiconductor chip in the corresponding chip mounting region, the method may further include conducting a cleaning process.

According to the present invention, a DCA type semiconductor module can be repaired without using a redundancy chip in a different mounting region than where the failed chip was mounted.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
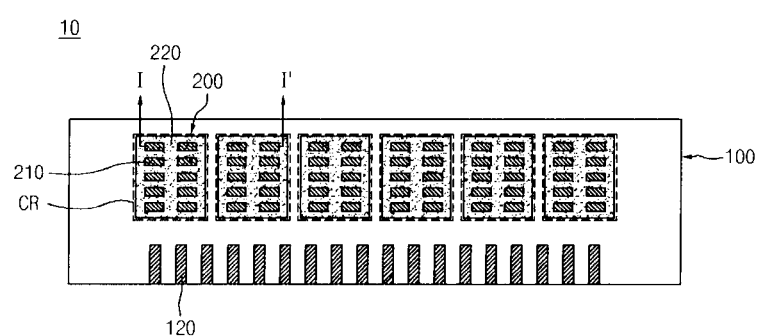
FIG. 1 is a plan view illustrating a module substrate in accordance with an embodiment of the present invention.
Figure 2:
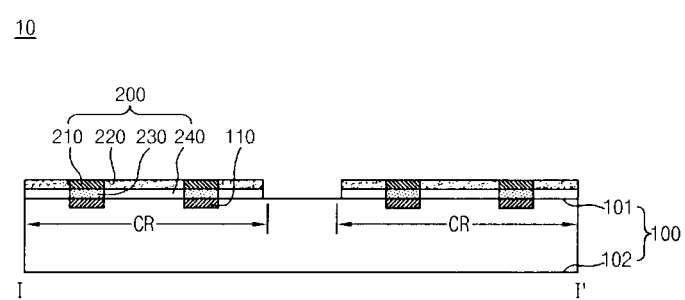
FIG. 2 is a cross-sectional view taken along the line I-I' of FIG. 1.

FIG. 1 is a plan view illustrating a module substrate in accordance with an embodiment of the present invention, and FIG. 2 is a cross-sectional view taken along the line I-I' of FIG. 1.

Referring to FIGS. 1 and 2, a module substrate 10 in accordance with an embodiment of the present invention includes a substrate body 100 and repair structures 200.

For example, the substrate body 100 can include a printed circuit board (PCB). The substrate body 100 has a first surface 101, a second surface 102 which faces away from the first surface 101, and four side surfaces (unlabeled). The first surface may be a top surface, and the second surface may be a bottom surface.

In the present embodiment, the substrate body 100 has a plurality of chip mounting regions CR which are defined on the first surface 101 and in which semiconductor chips are mounted. While it is described and illustrated in the present embodiment that the chip mounting regions CR are defined on the first surface 101 of the substrate body 100, it is to be readily understood that the chip mounting regions CR may also be defined on the second surface 102 of the substrate body 100 or on both the first surface 101 and the second surface 102 of the substrate body 100.

The substrate body 100 includes connection pads 110, connection tabs 120, and circuit wiring lines (not shown).

The connection pads 110 are formed in the plurality of chip mounting regions CR. In the present embodiment, a plurality of connection pads 110 are formed in each of the chip mounting regions CR.

The connection tabs 120 are to electrically connect the module substrate 10 with an external device, for example, a personal computer (PC). A plurality of connection tabs 120 are formed along each of one peripheral portions of the first surface 101 and the second surface 102 of the substrate body 100. The connection tabs 120 may be made from at least one conductive material such as, for example, gold (Au), copper (Cu), or alloy.

The circuit wiring lines are formed in the substrate body 100 and are electrically connected with the connection pads 110 and the connection tabs 120.

The repair structures 200 are respectively formed or mounted in the chip mounting regions CR. As described above, the repair structures 200 may have been manufactured as part of the substrate body 100. Alternatively, the repair structures 200 may have been manufactured separately from the substrate body 100 and mounted on the mounting pads in the chip mounting regions.

Each repair structure 200 includes conductive layer patterns 210, an insulation layer pattern 220, plastic conductive members 230, and a plastic insulation member 240.

The conductive layer patterns 210 are formed over the connection pads 110 in the chip mounting region CR. In the present embodiment, the conductive layer patterns 210 have the same shape as the connection pads 110 when viewed from the top. The conductive layer patterns 210 may be made from at least one conductive material such as, for example, gold (Au), copper (Cu), or alloy.

The insulation layer pattern 220 is formed in the chip mounting region CR in such a way as to expose the conductive layer patterns 210.

The plastic conductive members 230 are formed between the connection pads 110 and the conductive layer patterns 210. The plastic insulation member 240 is formed between the substrate body 100 and the insulation layer pattern 220 in the chip mounting region CR.

The plastic conductive members 230 may include, for example, a low melting point material which has a melting point in the range of approximately 100~300° C. For example, the plastic conductive members 230 may include at least any one selected among solder, lead (Pb), stannum (Sn), and indium (In).

The plastic insulation member 240 may include, for example, a thermal sensitive material (TSM) or a pressure sensitive material (PSM). The thermal sensitive material includes at least any one selected from among, for example, synthetic resin, polyethylene and polyamide, and the pressure sensitive material includes at least any one selected among, for example, resin, polystyrene, acryl, silicon, styrene, rubber and polypropylene.

Figure 3:
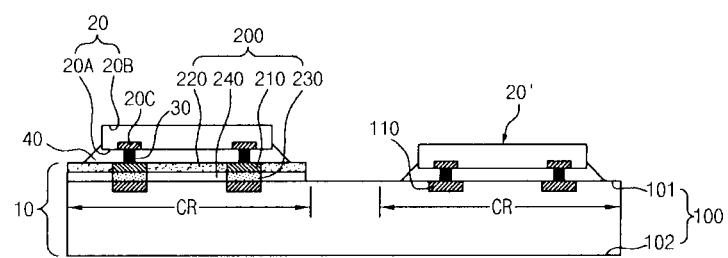
FIG. 3 is a cross-sectional view illustrating a semiconductor module in accordance with another embodiment of the present invention.

FIG. 3 is a cross-sectional view illustrating a semiconductor module in accordance with another embodiment of the present invention.

Referring to FIG. 3, there is shown a semiconductor module in accordance with another embodiment of the present invention comprising a module substrate 10, and a plurality of semiconductor chips 20 and 20'. In addition, the semiconductor module further includes connection members 30 and underfill members 40. The connection members 30 and the underfill member 40 (to be described later) may have a melting point temperature higher than the plastic conductive member 230, and also the plastic insulation member 240.

Referring to FIGS. 1 and 2, the module substrate 10 includes a substrate body 100 and repair structures 200.

For example, the substrate body 100 can include a printed circuit board (PCB). The substrate body 100 has a first surface 101, a second surface 102 which faces away from the first surface 101, and four side surfaces (unlabeled). The first surface may be a top surface, and the second surface may be a bottom surface.

In the present embodiment, the substrate body 100 has a plurality of chip mounting regions CR which are defined on the first surface 101 and in which semiconductor chips are mounted. While it is described and illustrated in the present embodiment that the chip mounting regions CR are defined on the first surface 101 of the substrate body 100, it is to be readily understood that the chip mounting regions CR may also be defined on the second surface 102 of the substrate body 100 or on both the first surface 101 and the second surface 102 of the substrate body 100.

The substrate body 100 includes connection pads 110, connection tabs 120, and circuit wiring lines (not shown).

The connection pads 110 are formed in the plurality of chip mounting regions CR. In the present embodiment, a plurality of connection pads 110 are formed in each of the chip mounting regions CR.

The connection tabs 120 are to electrically connect the module substrate 10 with an external device, for example, a personal computer (PC). A plurality of connection tabs 120 are formed along each of one peripheral portions of the first surface 101 and the second surface 102 of the substrate body 100. The connection tabs 120 include a conductive material such as, for example, gold (Au), copper (Cu), or alloy.

The circuit wiring lines are formed in the substrate body 100 and are electrically connected with the connection pads 110 and the connection tabs 120.

The repair structures 200 are respectively formed or mounted in the chip mounting regions CR. As described above, the repair structures 200 may have been manufactured as part of the substrate body 100. Alternatively, the repair structures 200 may have been manufactured separately from the substrate body 100 and mounted on the mounting pads in the chip mounting regions.

Each repair structure 200 includes conductive layer patterns 210, an insulation layer pattern 220, plastic conductive members 230, and a plastic insulation member 240.

The conductive layer patterns 210 are formed over the connection pads 110 in the chip mounting region CR. In the present embodiment, the conductive layer patterns 210 have the same shape as the connection pads 110 when viewed from the top. The conductive layer patterns 210 include gold (Au), copper (Cu), or alloy.

The insulation layer pattern 220 is formed in the chip mounting region CR in such a way as to expose the conductive layer patterns 210.

The plastic conductive members 230 are formed between the connection pads 110 and the conductive layer patterns 210, and the plastic insulation member 240 is formed between the substrate body 100 and the insulation layer pattern 220 in the chip mounting region CR.

The plastic conductive members 230 and the plastic insulation member 240 are formed of a material which may have a melting point lower than the connection members 30 and the underfill members 40 which will be described later in detail.

In detail, the plastic conductive members 230 may include a low melting point metal which has a melting point in the range of approximately 100~300° C. For example, the plastic conductive members 230 may include at least one selected from among solder, lead (Pb), stannum (Sn), and indium (In).

The plastic insulation member 240 may include, for example, a thermal sensitive material (TSM) or a pressure sensitive material (PSM). The thermal sensitive material may include at least one selected from among, for example, synthetic resin, polyethylene, and polyamide, and the pressure sensitive material may include at least one selected among resin, polystyrene, acryl, silicon, styrene, rubber, and polypropylene.

For illustrative purposes, a repair structure 200 in one of the chip mounting regions CR is shown as having been removed.

The semiconductor chips 20 and 20' are mounted in respective chip mounting regions CR of the module substrate 10.

A semiconductor chip, which is mounted in the chip mounting region CR where the repair structure 200 is present, is defined as a semiconductor chip 20, and a semiconductor chip, which is mounted in the chip mounting region CR where the repair structure 200 is removed, is defined as an additional semiconductor chip 20'. These definitions will be used in the following descriptions.

Each of the semiconductor chip 20 and the additional semiconductor chip 20' has a first surface 20A which faces the chip mounting region CR and a second surface 20B which faces away from the first surface 20A. Bonding pads 20C on the first surfaces 20A of the semiconductor chip 20 and the additional semiconductor chip 20' may be electrically connected with the conductive layer patterns 210 and the connection pads 110, respectively, in the chip mounting regions CR.

The connection members 30 may electrically connect the connection pads 110 in the chip mounting regions CR with the bonding pads 20C of the semiconductor chip 20 and the additional semiconductor chip 20', respectively. In the present embodiment, the connection members 30 may be, for example, bumps. In order to improve the reliability of joints, the underfill members 40 may be used to fill the area between the module substrate 10 and the semiconductor chip 20 and the additional semiconductor chip 20'.

Figure 4:
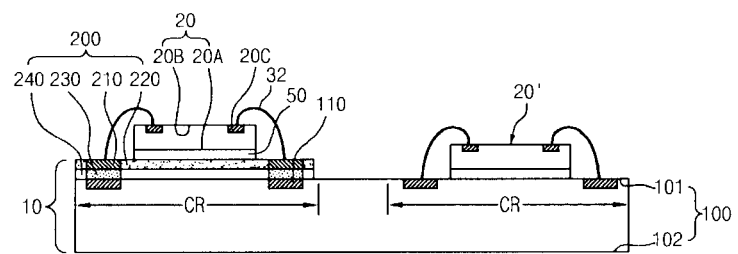
FIG. 4 is a cross-sectional view illustrating a semiconductor module in accordance with another embodiment of the present invention.

FIG. 4 is a cross-sectional view illustrating a semiconductor module in accordance with another embodiment of the present invention.

Referring to FIG. 4, there is shown a semiconductor module in accordance with another embodiment of the present invention includes a module substrate 10, and the plurality of semiconductor chips 20 and 20'. In addition, the semiconductor module further includes connection members 32 and adhesive members 50.

Referring to FIGS. 1 and 2, the module substrate 10 includes the substrate body 100 and the repair structures 200.

For example, the substrate body 100 can include a printed circuit board (PCB). The substrate body 100 has a first surface 101, a second surface 102 which faces away from the first surface 101, and four side surfaces (unlabeled).

In the present embodiment, the substrate body 100 has a plurality of chip mounting regions CR which are defined on the first surface 101 and in which semiconductor chips are mounted. While it is described and illustrated in the present embodiment that the chip mounting regions CR are defined on the first surface 101 of the substrate body 100, it is to be readily understood that the chip mounting regions CR may also be defined on the second surface 102 of the substrate body 100 or on both the first surface 101 and the second surface 102 of the substrate body 100.

The substrate body 100 includes connection pads 110, connection tabs 120, and circuit wiring lines (not shown).

The connection pads 110 are formed in the plurality of chip mounting regions CR. In the present embodiment, a plurality of connection pads 110 are formed in each of the chip mounting regions CR.

The connection tabs 120 are to electrically connect the module substrate 10 with an external device, for example, a personal computer (PC). A plurality of connection tabs 120 are formed along each of one peripheral portions of the first surface 101 and the second surface 102 of the substrate body 100. The connection tabs 120 include a conductive material such as, for example, gold (Au), copper (Cu), or alloy.

The circuit wiring lines are formed in the substrate body 100 and are electrically connected with the connection pads 110 and the connection tabs 120.

The repair structures 200 are respectively formed or mounted in the chip mounting regions CR. As described above, the repair structures 200 may have been manufactured as part of the substrate body 100. Alternatively, the repair structures 200 may have been manufactured separately from the substrate body 100 and mounted on the mounting pads in the chip mounting regions.

Each repair structure 200 includes conductive layer patterns 210, an insulation layer pattern 220, plastic conductive members 230, and a plastic insulation member 240.

The conductive layer patterns 210 are formed over the connection pads 110 in the chip mounting region CR. In the present embodiment, the conductive layer patterns 210 have the same shape as the connection pads 110 when viewed from the top. The conductive layer patterns 210 include gold (Au), copper (Cu), or alloy.

The insulation layer pattern 220 is formed in the chip mounting region CR in such a way as to expose the conductive layer patterns 210.

The plastic conductive members 230 are formed between the connection pads 110 and the conductive layer patterns 210. The plastic insulation member 240 is formed between the substrate body 100 and the insulation layer pattern 220 in the chip mounting region CR.

The plastic conductive members 230 and the plastic insulation member 240 are formed of a material which may have a melting point lower than the connection members 30 and the adhesive members 50 which will be described later in detail.

In detail, the plastic conductive members 230 include a low melting point metal which has a melting point in the range of approximately 100~300° C. For example, the plastic conductive members 230 may include at least one selected among solder, lead (Pb), stannum (Sn), and indium (In).

The plastic insulation member 240 may include, for example, a thermal sensitive material (TSM) or a pressure sensitive material (PSM). The thermal sensitive material may include at least one selected among synthetic resin, polyethylene, and polyamide, and the pressure sensitive material may include at least one selected among resin, polystyrene, acryl, silicon, styrene, rubber, and polypropylene.

For illustrative purposes, a repair structure 200 in one of the chip mounting regions CR is shown as being removed.

The semiconductor chips 20 and 20' are mounted in respective chip mounting regions CR of the module substrate 10.

A semiconductor chip, which is mounted in the chip mounting region CR where the repair structure 200 is present, is defined as a semiconductor chip 20, and a semiconductor chip, which is mounted in the chip mounting region CR where the repair structure 200 is removed, is defined as an additional semiconductor chip 20'. These definitions will be used in the following descriptions.

Each of the semiconductor chip 20 and the additional semiconductor chip 20' has the first surface 20A which faces the chip mounting region CR and the second surface 20B which faces away from the chip mounting region CR. The first surfaces 20A of the semiconductor chip 20 and the additional semiconductor chip 20' are attached to the module substrate 10 inside the connection pads 110 in the chip mounting regions CR by adhesive members 50. Bonding pads 20C on the second surfaces 20B of the semiconductor chip 20 and the additional semiconductor chip 20' in such a way as to be electrically connected with the connection pads 110 in the chip mounting regions CR.

The connection members 32 may electrically connect the connection pads 110 in the chip mounting regions CR with the bonding pads 20C of the semiconductor chip 20 and the additional semiconductor chip 20', respectively. In the present embodiment, the connection members 32 may include, for example, bonding wires.

A semiconductor module repair process is conducted in such a manner that a failed semiconductor chip, which is sorted as a bad product through a memory module test, and the corresponding repair structure 200 are removed from the memory module. An additional semiconductor chip is mounted in the corresponding chip mounting region CR where failed semiconductor chip and the repair structure 200 were removed.

The semiconductor module repaired through such a repair process has a configuration in which the repair structure 200 is removed from at least one of the plurality of chip mounting regions CR.

Figure 5:
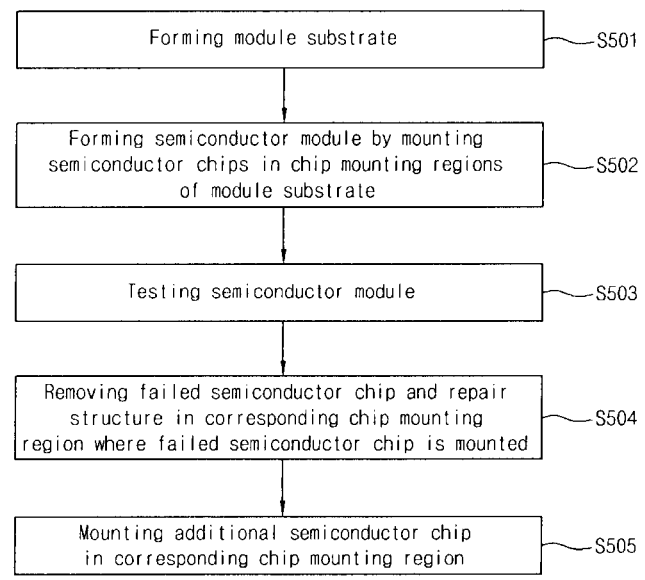
FIG. 5 is a flow chart showing a method for manufacturing a semiconductor module in accordance with another embodiment of the present invention.

FIG. 5 is a flow chart showing a method for manufacturing a memory module in accordance with another embodiment of the present invention, and FIGS. 6 through 10 are cross-sectional views illustrating the respective processes of the method of FIG. 5.

Figure 6:
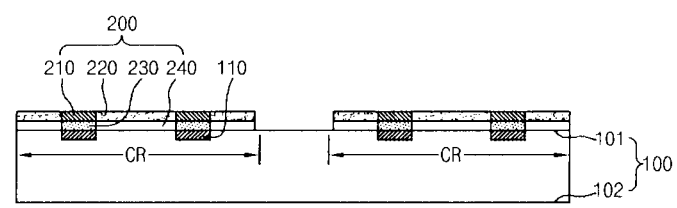
FIGS. 6 through 10 are cross-sectional views illustrating the respective processes of the method of FIG. 5.

Referring to FIGS. 5 and 6, in order to form a memory module, a module substrate 10 which has repair structures 200 is formed first (S501).

In order to form the module substrate 10, first, a substrate body 100, which has connection pads 110 and is defined with chip mounting regions CR, is prepared.

Hereinafter, one surface of the substrate body 100 on which the chip mounting regions CR are formed is defined as a first surface 101, and the other surface of the substrate body 100 which faces away from the first surface 101 is defined as a second surface 102. Further, surfaces that connect the first surface 101 and the second surface 102 are defined as side surfaces.

The substrate body 100 which is defined with the chip mounting regions CR on the first surface 101 and/or on the second surface 102 may be used in the present embodiment.

The substrate body 100 can include connection tabs 120. The connection tabs 120 are to electrically connect the module substrate 10 with an external device, for example, a personal computer (PC). A plurality of connection tabs 120 are formed along each of one peripheral portions of the first surface 101 and the second surface 102 of the substrate body 100. The connection tabs 120 include conductive material such as, for example, gold (Au), copper (Cu), or alloy.

After the substrate body 100 is prepared, repair structures 200 are respectively formed in the chip mounting regions CR of the substrate body 100.

Each repair structure 200 includes conductive layer patterns 210 which are formed over the connection pads 110 in the chip mounting region CR. An insulation layer pattern 220 may be formed in the chip mounting region CR in such a way as to expose the conductive layer patterns 210 and the plastic conductive members 230. The plastic conductive members 230 may be formed between the connection pads 110 and the conductive layer patterns 210. The plastic insulation member 240 may be formed between the substrate body 100 and the insulation layer pattern 220 in the chip mounting region CR.

The conductive layer patterns 210 include gold (Au), copper (Cu), or alloy.

The plastic conductive members 230 and the plastic insulation member 240 are formed of a material which has a melting point lower than connection members 30 and underfill members 40 which will be described later in detail. In detail, the plastic conductive members 230 may include, for example, a low melting point metal which has a melting point in the range of approximately 100~300° C. For example, the plastic conductive members 230 include at least one selected from, for example, solder, lead (Pb), stannum (Sn), and indium (In). The plastic insulation member 240 may be, for example, a thermal sensitive material (TSM) or a pressure sensitive material (PSM). The thermal sensitive material may include at least one selected from, for example, synthetic resin, polyethylene, and polyimide, and the pressure sensitive material may include at least one selected among resin, polystyrene, acryl, silicon, styrene, rubber, and polypropylene.

The repair structures 200 can be prepared in the form of films, for example, separately from the substrate body 100 and then be attached in the chip mounting regions CR of the substrate body 100.

Alternatively, the repair structures 200 may be formed in such a manner that the conductive layer patterns 210 are formed over the connection pads 110 formed on the first surface 101 of the substrate body 100 by the medium of the plastic conductive members 230, an insulation layer is formed over the first surface 101 of the substrate body 100 by the medium of the plastic insulation members 240 in such a way as to expose the conductive layer patterns 210, and portions of the insulation layer which are formed outside the chip mounting regions CR are removed.

Figure 7:
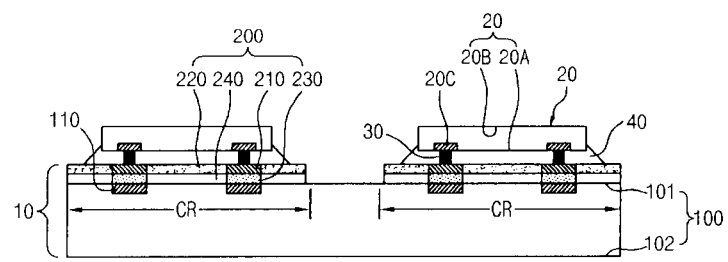

Referring to FIGS. 5 and 7, after the module substrate 10 having the repair structures 200 is formed, semiconductor chips 20 are respectively mounted in the chip mounting regions CR of the module substrate 10, by which a semiconductor module is formed (S502).

In order to mount the semiconductor chips 20 in the chip mounting regions CR, in the present embodiment, bonding pads 20C of the semiconductor chips 20 and the connection pads 110 in the chip mounting regions CR are electrically connected with each other by using the connection members 30, which may be, for example, bumps. In order to improve the reliability of joints, the underfill members 40 may be used to fill the area between the semiconductor chips 20 and the module substrate 10 in the chip mounting regions CR.

Second surfaces 20B, which face away from first surfaces 20A of the semiconductor chips 20 on which bonding pads 20C are formed, may be attached to the module substrate 10 in the chip mounting regions CR, and the bonding pads 20C of the semiconductor chips 20 and the connection pads 110 in the chip mounting regions CR may be electrically connected with each other by using connection members 30, for example, bonding wires. The semiconductor chips 20 may also be mounted as described with respect to FIG. 4. Accordingly, the bonding pads 20C on the second surface 20B may be electrically connected to the connection pads 110 by using the connection members 32, which may be, for example, bonding wires.

Referring to FIG. 5, after the semiconductor module is formed, the semiconductor module is tested (S503). By testing the semiconductor module, it may be possible to determine whether any of the semiconductor chips in the semiconductor module is faulty.

Figure 8:
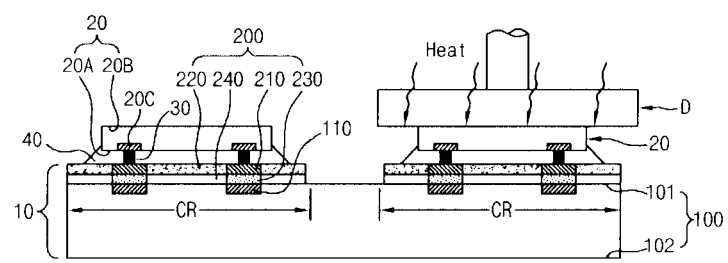
Figure 9:
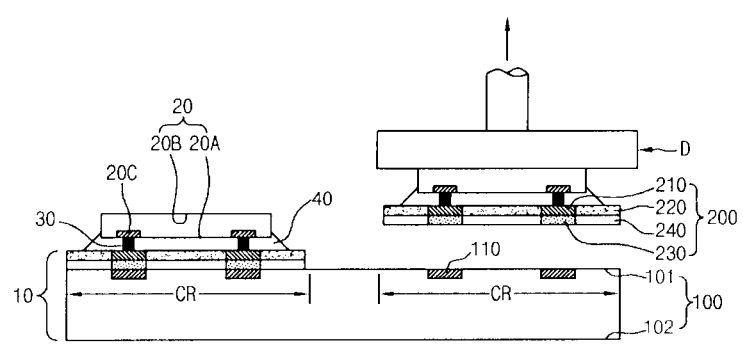

Referring to FIGS. 5, 8 and 9, after the semiconductor module is tested, a failed (faulty) semiconductor chip 20 and a corresponding repair structure 200 in a corresponding chip mounting region CR are removed (S504).

In order to remove the failed semiconductor chip 20 and the corresponding repair structure 200, as shown in FIG. 8, the failed semiconductor chip 20 is heated using a die pickup device D which has a heating unit (not shown). As heat is transferred through the failed semiconductor chip 20 to the corresponding repair structure 200 of the corresponding chip mounting region CR where the failed semiconductor chip 20 is mounted, the plastic conductive members 230 and the plastic insulation member 240 of the repair structure 200 in the corresponding chip mounting region CR are melted. Accordingly, the adhesion forces of the plastic conductive members 230 and the plastic insulation member 240 decrease. Next, as shown in FIG. 9, with the failed semiconductor chip 20 picked up by the die pickup device D by vacuum, the die pickup device D is raised, and the failed semiconductor chip 20 and the repair structure 200 in the corresponding chip mounting region CR where the failed semiconductor chip 20 is mounted are detached from the semiconductor module.

After the failed semiconductor chip 20 and the repair structure 200 in the corresponding chip mounting region CR where the failed semiconductor chip 20 is mounted are removed, a process for cleaning the semiconductor module can be conducted.

Figure 10:
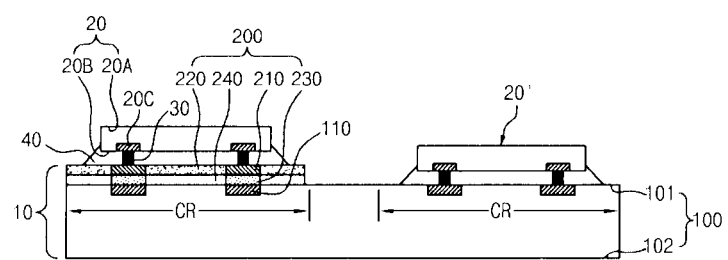

Referring to FIGS. 5 and 10, after the semiconductor module is cleaned, an additional semiconductor chip 20' is mounted in the corresponding chip mounting region CR from where the repair structure 200 was removed (S505).

While various embodiments of the invention may have described specific characteristics, the invention need not be so limited. For example, the plastic conductive members 230 have been described as having melting points between approximately 100° C. to 300° C. However, various embodiments of the invention may comprise plastic conductive members 230 whose melting point is not in the above stated temperature range but is still low enough so that the semiconductor chip 20 and at least a portion of the repair structure 200 can be removed from the substrate body 100 without unduly damaging the connection pads 110. This may be a design and/or an implementation decision.

Furthermore, the plastic conductive members 230 may have a different melting point than the plastic insulation member 240. This may be because, for example, while it may be desirable to protect the connection pads 110 when removing the repair structure 200, the portions of the substrate body 100 that may be under the plastic insulation member 240 may not need such protection from damage. This may be a design and/or an implementation decision.

Additionally, various embodiments of the invention have described the insulation pattern 220 and the plastic insulation member 240 as part of the repair structure 200. However, the invention need not be so limited. For example, when a semiconductor chip 20' is mounted as described in FIG. 3, there may not be a need for the insulation pattern 220 and the plastic insulation member 240. This may be a design and/or an implementation decision.

As is apparent from the above description, a DCA type semiconductor module can be repaired without using a redundancy chip method where additional layout area is dedicated to the redundancy chip. Accordingly, various embodiments of the invention may provide a way to replace a faulty semiconductor chip once for each chip mounting region CR. However, the invention need not be limited to a single repair structure 200 in each chip mounting region CR. For example, there may be a plurality of repair structures 200 stacked on top of each other, and there may be different numbers of repair structures 200 for different chip mounting region CR. This may allow for removal of more than one faulty semiconductor chip for some chip mounting regions CR.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A module substrate comprising:
a substrate body,
wherein the substrate body comprises:
at least one surface having a plurality of chip mounting regions;
connection pads formed in each of the chip mounting regions;
a removable repair structure in at least one of the chip mounting regions,
wherein the removable repair structure comprises:
conductive layer patterns formed over the connection pads in each chip mounting region;
an insulation layer pattern formed over the substrate body in each chip mounting region in such a way as to expose the conductive layer patterns, wherein the insulation layer pattern is only formed over the chip mounting regions;
plastic conductive members formed between the connection pads and the conductive layer patterns; and
a plastic insulation member formed between the substrate body and the insulation layer pattern in each chip mounting region,
wherein the plastic insulation member is only formed on the chip mounting regions and the plastic insulation member is in direct contact with both of the substrate body and the insulation layer pattern.

2. The module substrate according to claim 1, wherein the plastic conductive members has a melting point lower than at least the conductive layer patterns.

3. The module substrate according to claim 1, wherein the plastic insulation member is substantially the same height as the plastic conductive members.

4. The module substrate according to claim 3, wherein the plastic insulation member comprises one of: a thermoplastic adhesive and a pressure sensitive adhesive.

5. The module substrate according to claim 3, wherein the insulation layer pattern is substantially the same height as the conductive layer patterns.

6. The module substrate according to claim 1, wherein the substrate body has a first surface and a second surface, and the chip mounting regions are defined on at least any one of the first surface and the second surface of the substrate body.

7. A semiconductor module comprising:
a module substrate comprising:
a substrate body,
wherein the substrate body comprises:
at least one surface having a plurality of chip mounting regions; and
connection pads formed in the chip mounting regions on the at least one surface;
removable repair structures respectively formed in the plurality of chip mounting regions,
wherein each removable repair structure comprises:
conductive layer patterns formed over the connection pads in each chip mounting region;
an insulation layer pattern formed over the substrate body in each chip mounting region in such a way as to expose the conductive layer patterns, wherein the insulation layer pattern is only formed over the chip mounting regions;

plastic conductive members formed between the connection pads and the conductive layer patterns; and a plastic insulation member formed between the substrate body and the insulation layer pattern in each chip mounting region, and a plurality of semiconductor chips respectively mounted in the chip mounting regions of the module substrate, wherein the plastic insulation member is only formed on the chip mounting regions and the plastic insulation member is in direct contact with both of the substrate body and the insulation layer pattern.

8. The semiconductor module according to claim 7, further comprising:

connection members electrically connecting the semiconductor chips and the connection pads in the chip mounting regions; and one of underfill members and adhesive members formed between the semiconductor chips and the module substrate in the chip mounting regions.

9. The semiconductor module according to claim 8, wherein the plastic conductive members and the plastic insulation member have a melting point lower than at least the connection members.

10. The semiconductor module according to claim 9, wherein the plastic conductive members comprise a low melting point metal.

11. The semiconductor module according to claim 9, wherein the plastic insulation member comprises a thermoplastic adhesive or a pressure sensitive adhesive.

12. The semiconductor module according to claim 7, wherein the plastic conductive members comprise at least one of the following: solder, lead, stannum, and indium.

13. The semiconductor module according to claim 7, wherein the substrate body has a first surface and a second surface which faces away from the first surface, and the chip mounting regions are defined on at least any one of the first surface and the second surface of the substrate body.

* * * * *